United States Patent
Yang

(10) Patent No.: US 8,780,295 B2
(45) Date of Patent: Jul. 15, 2014

(54) LIGHT CAVITY THAT IMPROVES LIGHT OUTPUT UNIFORMITY

(75) Inventor: Hao-Yu Yang, Taoyuan (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 266 days.

(21) Appl. No.: 13/073,305

(22) Filed: Mar. 28, 2011

(65) Prior Publication Data

US 2012/0249925 A1 Oct. 4, 2012

(51) Int. Cl.
*G02F 1/1335* (2006.01)
*F21V 7/04* (2006.01)

(52) U.S. Cl.
USPC .............. 349/64; 349/61; 349/71; 362/612; 362/613

(58) Field of Classification Search
USPC .............. 349/61, 62, 64, 65, 69, 58, 71; 362/612–614
See application file for complete search history.

(56) References Cited

U.S. PATENT DOCUMENTS

| | | | |
|---|---|---|---|
| 7,513,669 B2 | 4/2009 | Chua et al. | |
| 2008/0165539 A1* | 7/2008 | Hsu et al. | 362/309 |
| 2008/0231170 A1* | 9/2008 | Masato et al. | 313/501 |
| 2009/0290099 A1* | 11/2009 | Lin et al. | 349/70 |
| 2010/0225851 A1* | 9/2010 | Chang | 349/71 |

* cited by examiner

*Primary Examiner* — Wen-Ying P Chen
(74) *Attorney, Agent, or Firm* — Haynes and Boone, LLP

(57) ABSTRACT

A radiation device is disclosed. The device includes a light cavity including a top surface, a bottom surface, and side walls. A light source array including at least one light source is formed on a first side wall. The device also includes a reflective coating formed on at least the bottom surface. The top surface allows light transmission and includes a light conversion layer.

20 Claims, 6 Drawing Sheets

LIGHT CAVITY THAT IMPROVES LIGHT OUTPUT UNIFORMITY

BACKGROUND

Light cavities are often used in applications requiring relatively uniform illumination of an area such as LCD and other backlit display technologies.

Traditional light cavity designs use direct illumination, meaning the light source is positioned on a surface parallel to the output surface. In designs using multiple light sources (e.g. an array or grid of LEDs), any variation in the wavelength or intensity of the light produced by the light sources will be evident at the output surface in the form of "hot spots" and/or other output artifacts indicating poor light output uniformity. In addition, such a configuration places more stringent requirements on the lighting characteristics of the different light sources to reduce the appearance of these artifacts, leading to increased time and cost in manufacturing.

Accordingly, what is needed is a light cavity that improves light output uniformity and allows light sources with a wider range of intensities and wavelengths to be used.

SUMMARY

The present disclosure provides a light radiation device. The device includes a light cavity including a top surface, a bottom surface, and a side wall. A light source array including at least one light source is formed on the first side wall. The device also includes a reflective coating formed on the bottom surface. A light conversion layer is formed on the top surface of the light cavity.

The present disclosure also provides a method. The method includes forming a light cavity having a top surface, a bottom surface and a side surface, forming a light source array including at least one light source on the side surface, forming a reflective coating on the bottom surface, and forming a light conversion layer on the top surface.

The present disclosure also provides a device. The device includes a bottom surface, a light conversion layer positioned above the bottom surface, the light conversion layer including a red phosphor layer and a green phosphor layer, the red phosphor layer being closer to bottom surface than the green phosphor layer, a first side surface positioned between and substantially transverse to the light conversion layer and the bottom surface, the first side surface including a plurality of light sources, and a reflective layer formed on the bottom surface.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
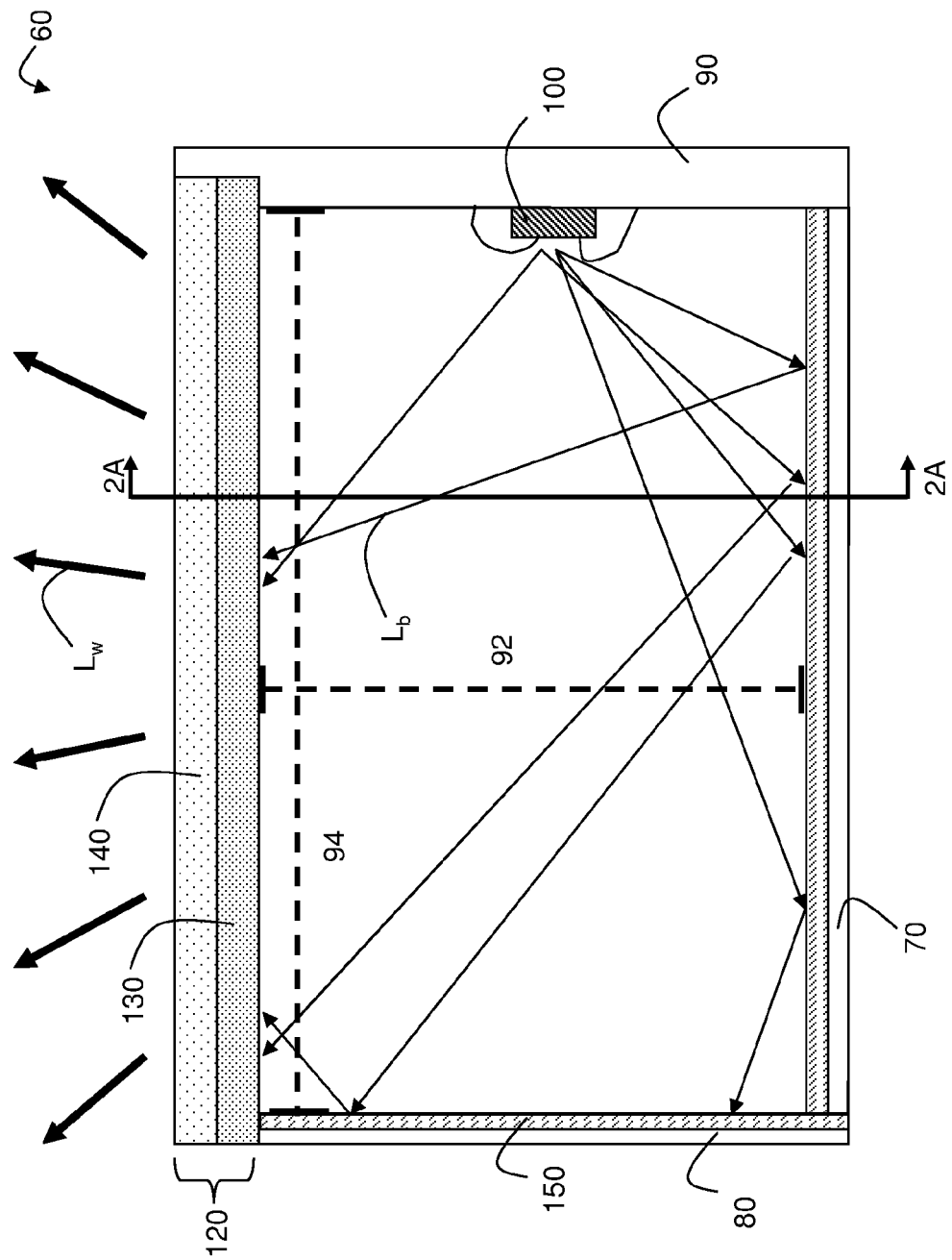
FIG. 1 is a cross-sectional view of an embodiment of a light cavity according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of an embodiment of a light cavity 60 according to various aspects of the present disclosure. As shown, the light cavity 60 has a bottom surface 70 and two side surfaces 80, 90. In certain embodiments, the side surfaces 80 and 90 are positioned parallel to one another. In such embodiments, the side surfaces 80 and 90 are positioned perpendicular to the bottom surface 70. In other embodiments, the side surfaces 80 and 90 will be positioned at an acute angle relative to the bottom surface 70. In yet other embodiments, the side surfaces 80 and 90 will be positioned at an obtuse angle relative to the bottom surface 70. In still other embodiments, one of the side surfaces 80, 90 will be positioned at an acute angle and the other side surface will be positioned at an obtuse angle relative to the bottom surface 70. In certain embodiments, the light cavity 60 may have a height 92 between about 1 and 10 centimeters (cm) and a width 94 between about 10 and 100 cm. In other embodiments, the height and width may be greater than or less than these ranges.

Figure 2:
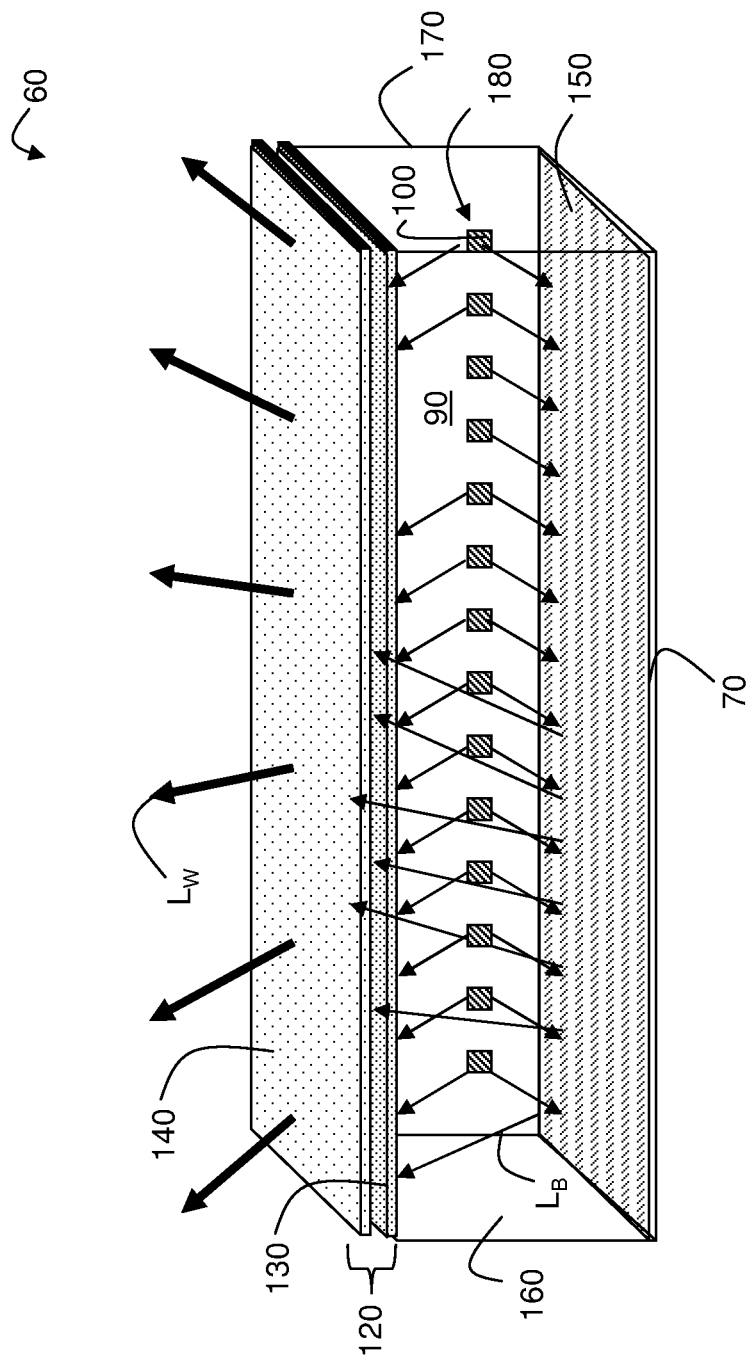
FIG. 2 is a cross-sectional view of the light cavity of FIG. 1 taken along line 2A-2A according to various aspects of the present disclosure.

A light source 100 is formed on the side surface 90 of the light cavity 60. The light source 100 may be formed at any position on the side surface 90, for example closer to the top in one embodiment, or closer to the bottom in another embodiment, or closer to the middle in yet another embodiment. In certain embodiments, the light source 100 may be a light emitting diode or LED. In one embodiment, the light source 100 will be one of a plurality of light sources arranged on the side surface 90 (as shown in FIG. 2 and discussed in more detail below). The light source 100 is configured to emit light $L_B$ at a certain wavelength within a desired range of wavelengths. In one embodiment, the light source 100 is configured to emit light with a wavelength between about 450 nanometers (nm) and about 500 nm (blue visible light). In such embodiment, the light source 100 may be an LED configured to emit blue light, for example a gallium nitride (GaN) or indium gallium nitride (InGaN) LED. In other embodiments, the light source 100 is configured to emit light with a wavelength less than 400 nm (ultraviolet light).

In an embodiment, a light conversion layer 120 is positioned parallel to the bottom surface 70 of the light cavity 60. In other embodiments, the light conversion 120 may be spaced apart from the bottom surface 70 but is not necessarily parallel to the bottom surface 70. In certain embodiments, the light conversion layer 120 is made up of one or more phosphor layers 130, 140. As shown in FIG. 2, the light conversion layer is made up of a red phosphor layer 130 and a green phosphor layer 140. The phosphor layers 130, 140 are used to convert a portion of the light $L_B$ emitted by the light source 100 into a different wavelength of light. For example, when the light $L_B$ strikes the red phosphor layer 130, a portion of the photons making up the light $L_B$ will be absorbed. The absorbed photons cause the red phosphor layer 130 to emit photons with a wavelength corresponding to visible red light. A certain portion of the light $L_B$ will pass through the red phosphor layer 130 without being converted in this manner. In certain embodiments, the blue light $L_B$ emitted by the light source 100 strikes the red phosphor layer 130, causing a certain amount of red light to be emitted by the red phosphor layer 130 and a certain portion of blue light to pass through. This red and blue light then strikes the green phosphor layer 140. A portion of the blue light striking the green phosphor layer 140 is converted to green light as discussed above, and a remaining portion of the blue light passes through without being converted. Substantially all of the red light passes through without being absorbed by the green phosphor, while only a small portion of red light may be absorbed by the green phosphor without causing an emission of green light. A mixture of red, green and blue light is thus emitted from the green phosphor layer 140 and output from the light cavity 60. This mixture of red, green and blue light is perceived as white light $L_W$ by the human eye.

In certain embodiments, the red phosphor layer 130 will be positioned below the green phosphor layer 140, such that the light $L_B$ from the interior of the cavity 60 strikes the red phosphor layer 130 first. In such embodiments, generally, phosphor layers producing longer wavelengths of light should be positioned closer to the interior of the cavity than phosphor layer producing shorter wavelengths. This configuration avoids the phosphor reconversion phenomena, where light converted by the inner phosphor layers is reconverted by the outer phosphor layers.

In certain embodiments, the red phosphor layer 130 may be composed of a phosphorescent or fluorescent material operable to emit light at wavelengths in the visible red spectrum between 620 and 750 nm. These materials include, for example, $Y_2O_2S$ with a $Eu+Fe_2O_3$ activator ($Y_2O_2S$:Eu+$Fe_2O_3$) (P22R), $(KF,MgF_2)$:Mn (P26), $MgF_2$:Mn (P33), $(Zn,Mg)F_2$:Mn (P38), $CaSiO_3$:Pb,Mn, $(Y,Eu)_2O_3$, $Y_2O_3$:Eu, $Mg_4(F)GeO_6$:Mn, $Y(P,V)O_4$:Eu, $YVO_4$:Eu, $Y_2O_2S$:Eu, $Mg_5As_2O_{11}$:Mn, or any other phosphor known in the art to emit light at wavelengths in the visible red spectrum.

In certain embodiments, the green phosphor layer 140 may be composed of a phosphorescent or fluorescent material operable to emit light at wavelengths in the visible green spectrum between 495 and 570 nm. These materials include, for example, $Zn_2SiO_4$:Mn (P1), ZnO:Zn (P4), $Zn_2SiO_4$:Mn,As (P39), $Gd_2O2_S$:Tb (P43), $Y_3Al_5O_{12}$:Ce (P46), ZnS:Cu,Al, ZnS:Cu,Au,Al, $Y_2SiO_5$:Tb, $Y_2OS$:Tb, $Y_3(Al,Ga)_5O_{12}$:Ce, $(Ce,Tb)MgAl_{11}O_{19}$, $BaMgAl_{10}O_{17}$:Eu,Mn, $Ce_{0.67}Tb_{0.33}MgAl_{11}O_{19}$:Ce,Tb, $Zn_2SiO_4$:Mn,$Sb_2O_3$, $LaPO_4$:Ce,Tb, $(La,Ce,Tb)PO4$, $(La,Ce,Tb)PO_4$:Ce,Tb, or any other phosphor known in the art to emit light at wavelengths in the visible green spectrum.

The red and green phosphor layers 130, 140 have concentrations which may be varied according to the kind of light desired to be outputted by the light cavity. The thickness of the red and green phosphor layers 130, 140 may also be varied. In certain embodiments, the thickness will be between about 1 millimeter (mm) and about 5 mm. In other embodiments, the thickness may be greater than about 5 mm. In still other embodiments, the thickness may be less than about 1 mm. Depending on the amount of light emitted by the LED, different concentrations of different phosphors can produce white lights of different color temperature. For example, a higher concentration of red phosphor is used to produce a warmer white light having a lower color temperature.

In certain embodiments, an end user may change the light conversion layer 120 to alter the final light output. In an embodiment, the user adds additional phosphor layers to the light conversion layer 120 to change the light output. In another embodiment, the user removes phosphor layers from the light conversion layer 120 to change the light output. In another embodiment, the user removes one of the phosphor layers and replaces it with a phosphor layer with a different concentration. In another embodiment, the user adds additional layers to change the properties of the light output such as, for example, lenses, filters, or any other type of layer known in the art to change light properties.

Referring again to FIG. 1, a reflective coating 150 is formed over the side surface 80 and the bottom surface 70 of the light cavity 60. In certain embodiments, the reflective coating 150 may also be formed on the side surface 90. The reflective coating 150 is operable to reflect the light $L_B$. The light $L_B$ may be reflected multiple times within the light cavity 60 by the reflective coating 150 on the side surface 80 and the bottom surface 70 before it strikes the light conversion layer 120 at the top of the light cavity 60. This reflection increases the uniformity of the light $L_W$ output by the light conversion layer 120 by causing light $L_B$ emitted from different portions of the light source 100 (possibly having different wavelengths and different intensities) to strike the light conversion layer 120 in positions adjacent to each other. Light $L_W$ is then emitted from the opposite side of the light conversion layer 120 in corresponding positions, leading to a more uniform distribution of light from the light source 100. In embodiments containing more than one light source, this reflection mixes the light from the various sources to further increase uniformity and reduce the visibility of differing wavelengths and intensities of the different light sources.

In an embodiment, the reflective coating 150 is formed of a material operable to reflect light. In one embodiment, the reflective coating 150 is formed of titanium oxide or zinc oxide or a combination of both. In another embodiment, the reflective coating is formed of a metal such as, for example, Silver (Ag), Aluminum (Al), Copper (Cu), Titanium (Ti), Zinc (Zn), or any other metal suitable to reflect light. In certain embodiments, the reflective coating 150 may have a thickness between about 1 micrometer (μm) and about 10 μm.

In other embodiments, the reflective coating 150 may have a thickness greater than about 10 µm. In still other embodiments, the reflective coating may have a thickness less than about 1 µm. In other embodiments, the reflective coating 150 is formed by affixing or gluing a reflective film to a substrate, for example a glass substrate. In still other embodiments, the reflective coating 150 is a thin film.

Referring now to FIG. 2, a cross-sectional view of the light cavity 60 of FIG. 1 taken along line 2A-2A is shown. As shown, the light cavity 60 has two additional side surfaces 160, 170. The side surface 90 referred to in FIG. 1 is the back surface in FIG. 2 in relation to the reader. In the depicted embodiment, the side surfaces 160, 170 are positioned perpendicular to the bottom surface 70, and intersect to the side surface 90. The side surfaces 160, 170 are positioned parallel to each other. In other embodiments, the side surfaces 160 and 170 will be positioned at acute angles relative to the bottom surface 70. In other embodiments, the side surfaces 160 and 170 will be positioned at obtuse angles relative to the bottom surface 70. In still other embodiments, one of side surface 160, 170 will be positioned at an acute angle and the other side surface will be at an obtuse angle relative to the bottom surface 70. In certain embodiments, the side surfaces 90, 160, and 170, the bottom surface 70, the light conversion layer 120, and the side surface 80 (shown in FIG. 1) form a chamber.

In certain embodiments, the light cavity 60 contains a light source array 180 formed on side surface 90. The light source array 180 includes a plurality of light sources, including the light source 100 depicted in FIG. 1. In certain embodiments, the light source array 180 will contain between about 2 and about 30 individual light sources. In other embodiments, the light source array 180 will contain more than about 30 light sources. In still other embodiments, the light source array 180 will contain a single light source. The individual light sources may be positioned in a single row as depicted in FIG. 2. In other embodiments, the individual light sources may be arranged into multiple rows and columns (see FIG. 3). The individual light sources may be spaced between about 1 mm and about 10 mm apart. In other embodiments, the individual light sources may be spaced greater than about 10 mm apart.

In addition, the number of light sources in the array may be varied according to the total volume of the light cavity 60. In certain embodiments, a ratio between about 1 and 8 individual light sources per 10 cm$^3$ may be used. In other embodiments, a higher ratio of light sources to cavity volume may be used.

The reflective coating 150 is operable to reflect light $L_B$ multiple times within the light cavity 60 before it strikes the light conversion layer 120 at the top of the light cavity 60. This reflection increases the uniformity of the light $L_W$ output by the light conversion layer 120 as discussed relative to FIG. 1. In the embodiment depicted in FIG. 2, the reflective coating 150 is also operable to mix the light from the various sources of the light source array 180 to further increase uniformity and reduce the visibility of differing wavelengths and intensities of the different light sources. This mixing increases the uniformity of the light $L_W$ output from the light cavity 60. In addition, the mixing allows light sources with a greater variance of wavelengths and intensities to be used in light source array 180. This leads to decreased cost, as fewer light sources will be rejected for having wavelengths and intensities that are outside of the acceptable ranges.

Figure 3:
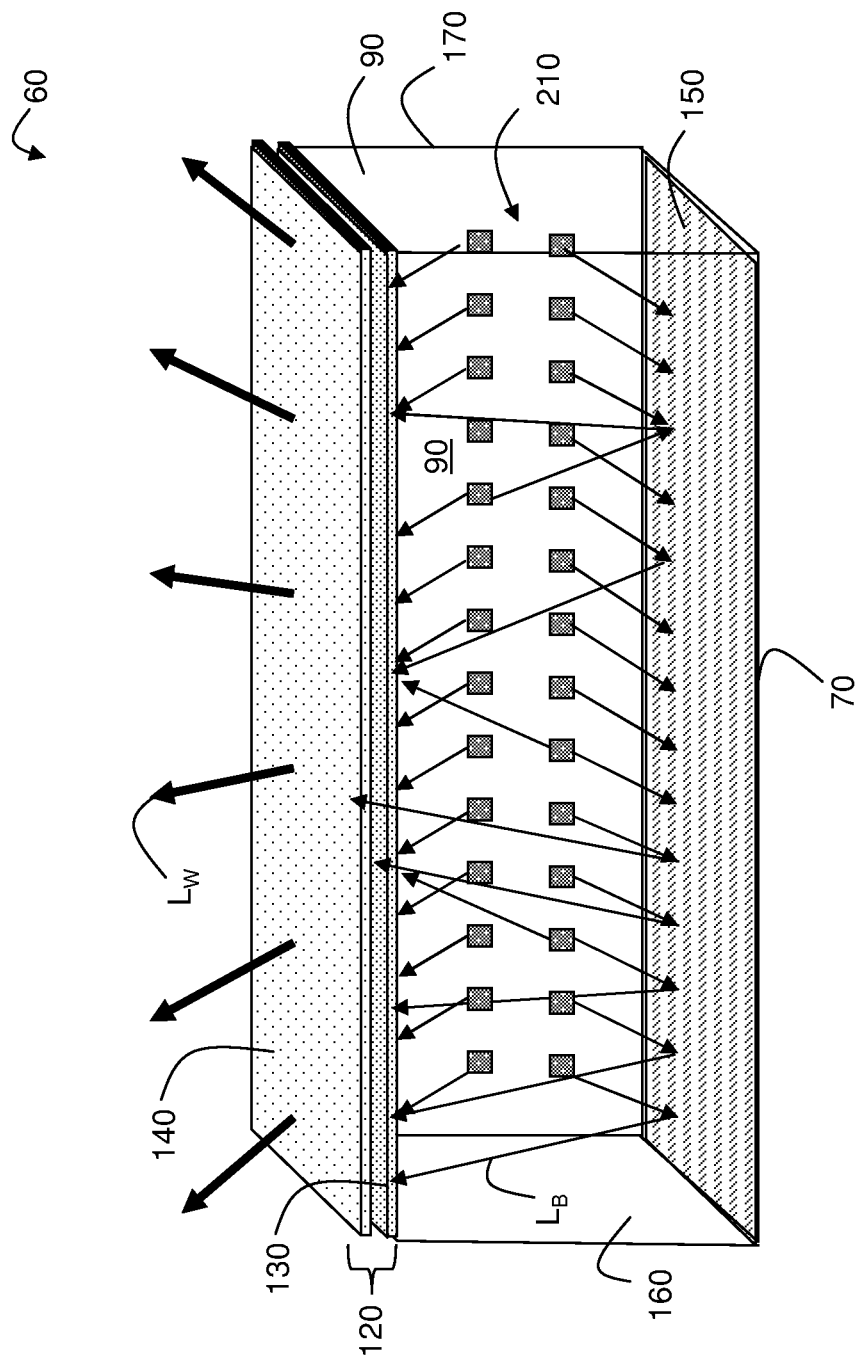
FIG. 3 is a cross-sectional view of another embodiment of the light cavity of FIG. 1 taken along line 2A-2A according to various aspects of the present disclosure.

Referring now to FIG. 3, a cross-sectional view of another embodiment 200 of the light cavity of FIG. 1 taken along line 2A-2A is shown. For clarity and consistency, the analogous components from FIG. 2 are identified using the same reference numbers. As shown, the light cavity 200 has a bottom surface 70, and three side surfaces 90, 160, 170. The light cavity 200 also includes side surface 80 from FIG. 1 not shown in the cross-sectional view. In the depicted embodiment, the side surfaces 160, 170 are positioned perpendicular to the bottom surface 70, and the side surface 90. The side surfaces 160, 170 are positioned parallel to each other. In other embodiments, the side surfaces 160 and 170 will be positioned at acute angles relative to the bottom surface 70. In other embodiments, the side surfaces 160 and 170 will be positioned at obtuse angles relative to the bottom surface 70. In still other embodiments, one of side surface 160, 170 will be positioned at an acute angle and the other side surface will be at an obtuse angle relative to the bottom surface 70. In certain embodiments, a reflective coating 150 is formed on the side surfaces 160, 170 and the bottom surface 70. In other embodiments, the reflective coating 150 is also formed on side surface 90.

A light source array 210 is formed on the side surface 90 of the light cavity 200. The light source array 210 differs from the light source array 180 of FIG. 2 in that it contains an additional row of individual light sources for a total of two rows. In certain embodiments, the light source array 210 may contain more than two rows of light sources. In other embodiments, the light source array 210 may be configured in a "checkerboard" pattern such that each row and column intersection does not contain a light source. In still other embodiments, the light source array 210 may be configured in any regular or irregular geometric pattern.

A light conversion layer 120 is positioned parallel to the bottom surface 70 of the light cavity 200. In certain embodiments, this light conversion layer 120 is made up of one or more phosphor layers. Similar to FIGS. 1 and 2, the light conversion layer 120 of light cavity 200 is made up of a red phosphor layer 130 and a green phosphor layer 140. The phosphor layers 130, 140 are used to convert a portion of the light $L_B$ emitted by the light source array 210 into a different wavelength of light. In certain embodiments, light emitted by the light conversion layer 120 is perceived as white light $L_W$ by the human eye, for the reasons discussed previously relative to FIG. 1.

The reflective coating 150 is operable to reflect light $L_B$ multiple times within the light cavity 60 before it strikes the light conversion layer 120 at the top of the light cavity 60. This reflection increases the uniformity of the light $L_W$ output by the light conversion layer 120. In the embodiment depicted in FIG. 3, the reflective coating 150 is also operable to mix the light from the various sources of the light source array 210 to further increase uniformity and reduce the visibility of differing wavelengths and intensities of the different light sources.

Figure 4:
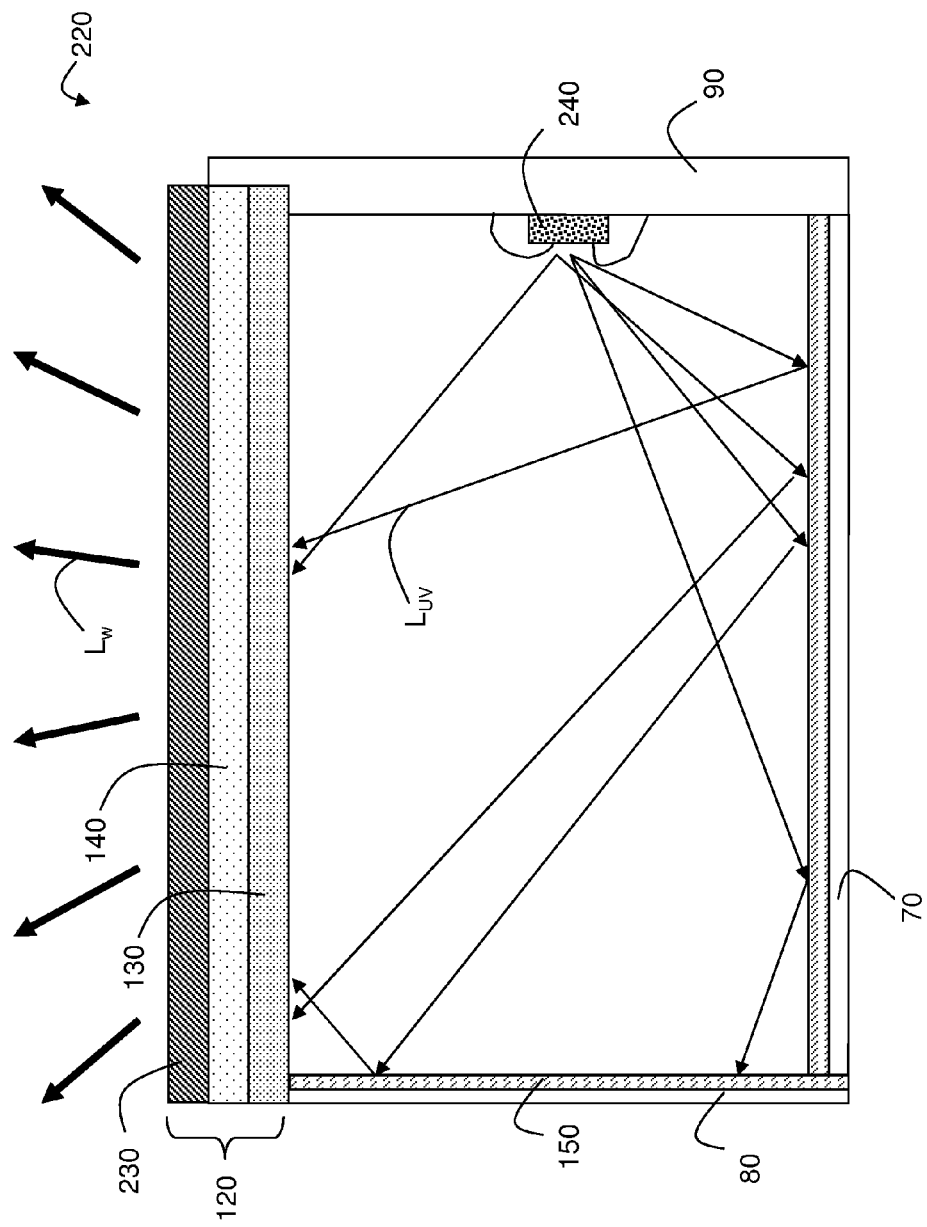
FIG. 4 is a cross-sectional view of another embodiment of a light cavity according to various aspects of the present disclosure.

Referring now to FIG. 4, a cross-sectional view of another embodiment of a light cavity 220 according to various aspects of the present disclosure. Because the embodiment shown in this figure is similar to earlier FIG. 1, repeated components retain the same reference numerals as in FIG. 1. Similar to the embodiment shown in FIG. 1, the light cavity 220 contains a bottom surface 70, side surfaces 80, 90, and a light conversion layer 120. The light conversion layer 120 contains red and green phosphor layers 130 and 140 as before, but also contains an additional layer of blue phosphor 230. In certain embodiments, the blue phosphor layer 230 may be positioned above the red and green phosphor layers 130, 140, such that light $L_{UV}$ from the interior of the cavity strikes the red and green phosphor layers 130, 140 before striking the blue phosphor layer 230. This configuration avoids the phosphor reconversion phenomena, where light converted by the inner phosphor layers is reconverted by the outer phosphor layers.

In certain embodiments, the blue phosphor layer 230 may be composed of a phosphorescent or fluorescent material operable to emit light at wavelengths in the visible blue spectrum between about 450 and about 475 nm. These materials include, for example, ZnS:Ag, Cl (P11), ZnS:Zn (P11), ZnS: Ag+Co-on-$Al_2O_3$ (P22B), $Y_2SiO_5$:Ce (P47), ZnS:Ag,Al (P55), ZnS:Ag, (Ba,Eu)$Mg_2Al_{16}O_{27}$, $BaMgAl_{10}O_{17}$:Eu,Mn, $BaMg_2Al_{16}O_{27}$:Eu, $CaWO_4$, $CaWO_4$:Pb, MgWO4, (Sr,Eu,Ba,Ca)$_5$(PO$_4$)$_3$Cl, Sr$_5$Cl(PO$_4$)$_3$:Eu, (Ca,Sr,Ba)$_3$(PO$_4$)$_2$Cl$_2$:Eu, (Sr,Ca,Ba)$_{10}$(PO$_4$)$_6$Cl$_2$:Eu, Sr$_2$P$_2$O$_7$:Sn(II), Ca$_5$F(PO$_4$)$_3$:Sb, 3Sr$_3$(PO$_4$)$_2$.SrF$_2$:Sb,Mn, or any other phosphor known in the art to emit light at wavelengths in the visible blue spectrum.

Referring again to FIG. 4, a light source 240 is formed on the side surface 90. In the depicted embodiment, the light source 240 is a light source operable to produce ultraviolet light $L_{UV}$ with wavelengths less than about 400 nm. In such embodiments, the light source 240 may be an LED configured to emit ultraviolet light, for example a diamond, boron nitride (BN), aluminum nitride (AlN), aluminum gallium nitride (AlGaN), or aluminum gallium indium nitride (AlGaInN) LED.

The phosphor layers 130, 140, and 230 are used to convert a portion of the ultraviolet light $L_{UV}$ emitted by the light source 240 into a different wavelength of light. For example, when the ultraviolet light $L_{UV}$ strikes the red phosphor layer 130, a portion of the photons making up the ultraviolet light $L_{UV}$ will be absorbed. The absorbed photons cause the red phosphor layer to emit photons with a wavelength corresponding to visible red light. A certain portion of the ultraviolet light $L_{UV}$ will pass through the red phosphor layer 130 without being converted in this manner. In certain embodiments, the ultraviolet light $L_{UV}$ emitted by the light source 240 strikes the red phosphor layer 130, causing a certain amount of red light to be emitted by the red phosphor layer 130 and a certain portion of ultraviolet light to pass through. This red and ultraviolet light then strikes the green phosphor layer 140. A portion of the ultraviolet light striking the green phosphor layer 140 is converted to green light as discussed above, and a portion of the ultraviolet light passes through without being converted. Substantially all of the red light passes through without being absorbed by the green phosphor, while only a small portion of red light may be absorbed by the green phosphor without causing an emission of green light. This red, green and ultraviolet light then strikes the blue phosphor layer 230. A portion of the ultraviolet light striking the blue phosphor layer 230 is converted to blue light as discussed above, and a portion of the ultraviolet light passes through without being converted. In certain embodiments, substantially all of the ultraviolet light is converted into either red, green or blue light. Substantially all of the red and green light passes through without being absorbed by the blue phosphor, while only a small portion of red and green light may be absorbed by the blue phosphor without causing an emission of blue light. Therefore, red, green, and blue light will be emitted from the blue phosphor layer 230 and output from the light cavity 220. This mixture of red, green and blue light is perceived as white light by the human eye. In some embodiments, a portion of the ultraviolet light $L_{UV}$ is left unconverted by the various phosphor layers 130, 140, 230.

Figure 5:
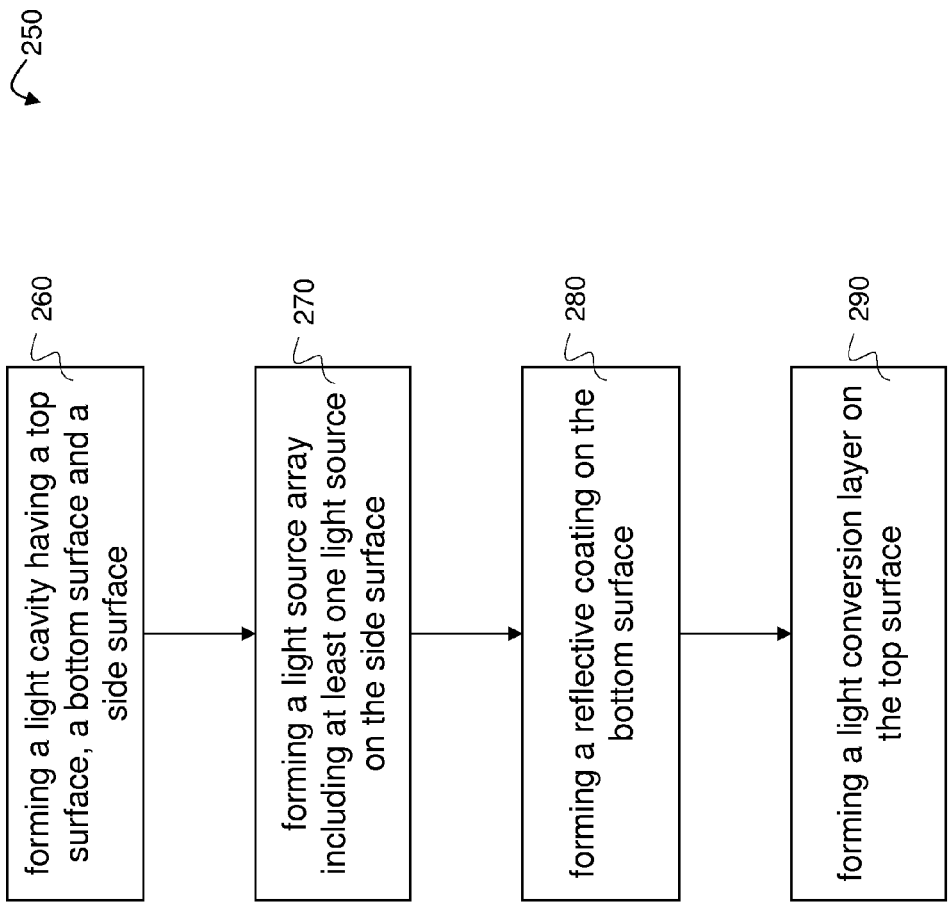
FIG. 5 is a flow chart showing a method according to various aspects of the present disclosure.

FIG. 5 is a flowchart showing a method 250 utilizing one embodiment according to the present disclosure. Step 260 involves forming a light cavity having a top surface, a bottom surface, and a side surface. Step 270 involves forming a light source array including at least one light source on the side surface. In certain embodiments, the Step 280 involves forming a reflective coating on the bottom surface. In some embodiments, the reflective coating is formed having a thickness between about 1 μm and about 10 μm. In an embodiment, the reflective coating is formed from titanium oxide, zinc oxide, a combination of both, or any material or combination of materials suitable for reflecting visible light. In another embodiment, the reflective coating is formed of a metal such as, for example, Silver (Ag), Aluminum (Al), Copper (Cu), Titanium (Ti), Zinc (Zn), or any other metal suitable to reflect light. Step 290 involves forming a light conversion layer on the top surface. In certain embodiments, the light conversion layer may be made up of one or more phosphor layers, for example a red phosphor layer and a green phosphor layer. In certain embodiments, the light conversion layer is configured to emit a combination of red, green and blue light, which is perceived by the human eye as white light. In other embodiments, the light conversion layer may be configured to other combinations of wavelengths of light. In other embodiments, the light conversion layer may be configured to emit a single wavelength of light different than the wavelength of light produced by the various light sources. Alternatively, the light conversion layer may emit that same wavelength of light produced by the various light sources.

Figure 6:
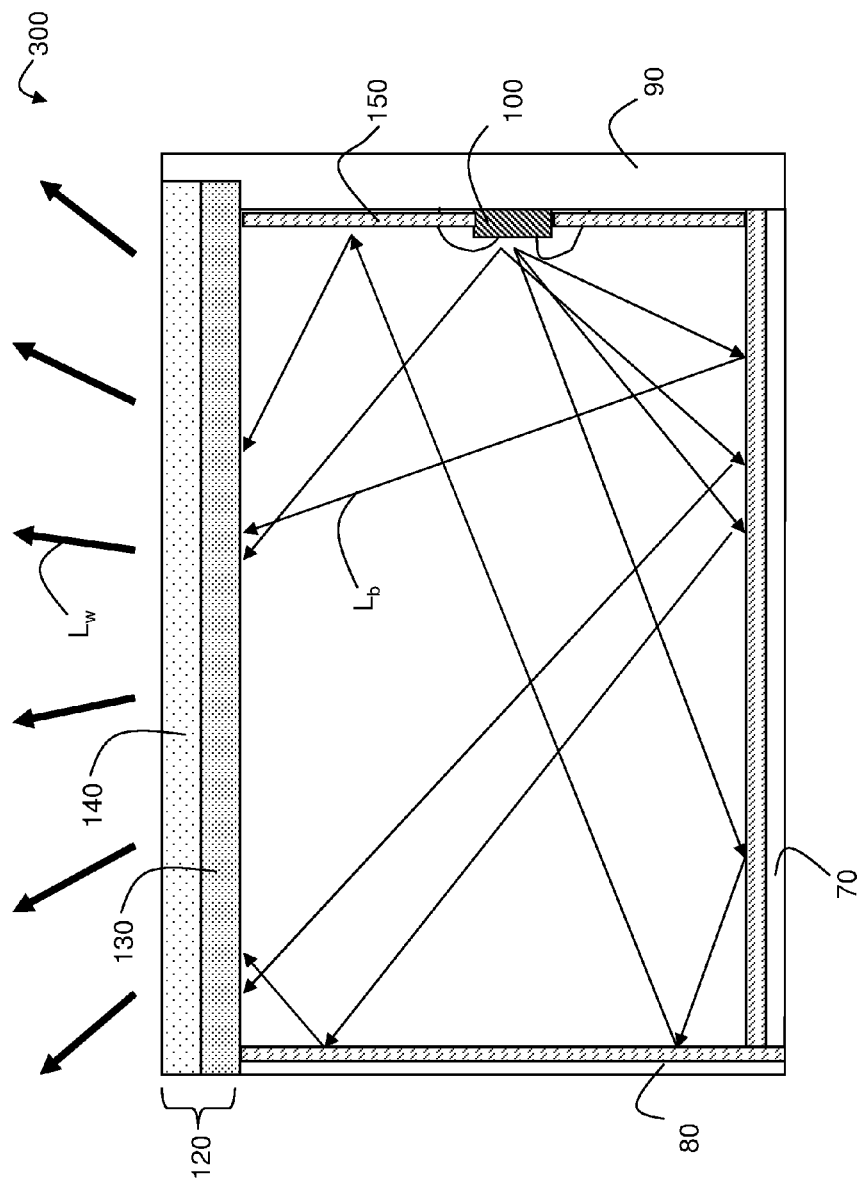
FIG. 6 is a cross-sectional view of another embodiment of a light cavity according to various aspects of the present disclosure.

Referring now to FIG. 6, a cross-sectional view of another embodiment of a light cavity 300 according to various aspects of the present disclosure. Similar to the light cavity 60 of FIG. 1, the light cavity 300 includes side surfaces 80 and 90, bottom surface 70, and light conversion layer 120. The light conversion layer 120 includes a red phosphor layer 130 and a green phosphor layer 140. A light source 100 is formed on the side surface 90. The light source 100 configured to emit blue light $L_B$. A reflective coating 150 is formed on bottom surface 70, and the two side surfaces 80 and 90. This embodiment differs from the embodiment depicted in FIG. 1 in that a reflective coating 150 is formed not only on the bottom surface 70 and the side surface 80, but also on the side surface 90. This additional reflective coating 150 increases the amount of $L_B$ that is reflected onto the light conversion layer 120, and thus output from the light cavity as white light $L_W$.

The various embodiments of the light cavity described in the present disclosure offer advantages over the prior art, it being understood that each embodiment may offer different advantages, and that no particular advantage is required for all embodiments. One advantage is the absence of "hot spots" and other artifacts related to insufficient mixing of light from the various sources. In practice, the light from each light source will vary slightly in intensity and wavelength. If all of the light from each light source is output directly from the cavity, these artifacts will be visible to a human observer. Embodiments of the light cavity described presently reduce the presence of these artifacts by mixing a portion the light from the various sources by reflecting it off the various reflective surfaces before outputting it from the cavity. The light from the various light sources strikes the top surface of the cavity at points that are adjacent to and intermixed with points at which light from other sources strike the top surface. Accordingly, the light that is output from the light cavity is a mix of the light from the various light sources within the cavity.

Another advantage of the various embodiments of the light cavity described in the present disclosure is the ability to use light sources producing a wider range of intensities and wavelengths of light. Since these differences between sources are masked due to the mixing of the light, fewer light sources will be rejected as producing too different an intensity or wavelength of light. This "wide binning" of light sources leads to savings in both time and cost.

Embodiments of the present light cavity can also be used in various applications. Examples of such applications include, but are not limited to: general lighting for indoor and outdoor use, light boxes for viewing partially transparent media such as slides, a mood lighting system where the light conversion layer is changeable or configurable by the consumer, refrigerator lighting, display lighting, lighting for entertainment events such as concerts, backing illumination for advertisements such as billboards, uniform illumination of a patient's body during surgery, or any application requiring a uniform light source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a light cavity including a first surface, a second surface and a light conversion layer, the second surface substantially opposing the light conversion layer, and the first surface extending from the second surface to the light conversion layer such that the first surface physically contacts the light conversion layer;
    at least one light source on the first surface, wherein the at least one light source includes a first row of plurality of light sources and a second row of plurality of light sources, wherein the first row of plurality of light sources is closer to the light conversion layer than the second row of plurality of light sources; and
    a reflective coating on the first and second surfaces.

2. The device of claim 1, wherein the second surface and the light conversion layer are substantially parallel,
    wherein the first surface is perpendicular to the second surface and the light conversion layer.

3. The device of claim 1, wherein the light cavity includes a plurality of additional surfaces, which together with the first and second surfaces and the light conversion layer defines a chamber having a first volume, and
    wherein a reflective coating is formed on one or more of the plurality of additional surfaces.

4. The device of claim 3, wherein the at least one light source includes a number of light sources related to the first volume by a first ratio, and
    wherein the first ratio is between about 1 light source per cubic centimeter and about 10 sources per cubic centimeter.

5. The device of claim 1, wherein the at least one light source is configured to emit blue light having a wavelength between about 450 nanometers and about 500 nanometers,
    wherein the light conversion layer includes a red phosphor layer and a green phosphor layer, and
    wherein the red phosphor layer is positioned closer to the second surface than the green phosphor layer,
    wherein the red phosphor layer includes a material selected from the group consisting of: $Y_2O_2S:Eu+Fe_2O_3$ (P22R), $(KF,MgF_2):Mn$ (P26), $MgF_2:Mn$ (P33), $(Zn,Mg)F_2:Mn$ (P38), $CaSiO_3:Pb,Mn$, $(Y,Eu)_2O_3$, $Y_2O_3:Eu$, $Mg_4(F)GeO_6:Mn$, $Y(P,V)O_4:Eu$, $YVO_4:Eu$, $Y_2O_2S:Eu$, and $Mg_5As_2O_{11}:Mn$, and
    wherein the green phosphor layer includes a material selected from the group consisting of: $Zn_2SiO_4:Mn$ (P1), $ZnO:Zn$ (P4), $Zn_2SiO_4:Mn,As$ (P39), $Gd_2O2_S:Tb$ (P43), $Y_3Al_5O_{12}:Ce$ (P46), $ZnS:Cu,Al$, $ZnS:Cu,Au,Al$, $Y_2SiO_5:Tb$, $Y_2OS:Tb$, $Y_3(Al,Ga)_5O_{12}:Ce$, $(Ce,Tb)MgAl_{11}O_{19}$, $BaMgAl_{10}O_{17}:Eu,Mn$, $Ce_{0.67}Tb_{0.33}MgAl_{11}O_{19}:Ce,Tb$, $Zn_2SiO_4:Mn,Sb_2O_3$, $LaPO_4:Ce,Tb$, $(La,Ce,Tb)PO4$, and $(La,Ce,Tb)PO_4:Ce,Tb$.

6. The device of claim 1, wherein the at least one light source is configured to emit ultraviolet light, the ultraviolet light being emitted from the at least one light source having a wavelength less than about 400 nm,
    wherein the light conversion layer includes a red phosphor layer, a green phosphor layer, and a blue phosphor layer,
    wherein the red phosphor layer is positioned closer to the at least one light source than the green phosphor layer,
    wherein the red phosphor layer and the green phosphor layer are positioned closer to the light source array than the blue phosphor layer, and
    wherein the blue phosphor layer includes a material selected from the group consisting of: $ZnS:Ag,Cl$ (P11), $ZnS:Zn$ (P11), $ZnS:Ag+Co$-on-$Al_2O_3$ (P22B), $Y_2SiO_5:Ce$ (P47), $ZnS:Ag,Al$ (P55), $ZnS:Ag$, $(Ba,Eu)Mg_2Al_{16}O_{27}$, $BaMgAl_{10}O_{17}:Eu,Mn$, $BaMg_2Al_{16}O_{27}:Eu$, $CaWO_4$, $CaWO_4:Pb$, $MgWO4$, $(Sr,Eu,Ba,Ca)_5(PO_4)_3Cl$, $Sr_5Cl(PO_4)_3:Eu$, $(Ca,Sr,Ba)_3(PO_4)_2Cl_2:Eu$, $(Sr,Ca,Ba)_{10}(PO_4)_6Cl_2:Eu$, $Sr_2P_2O_7:Sn(II)$, $Ca_5F(PO_4)_3:Sb$, and $3Sr_3(PO_4)_2.SrF_2:Sb,Mn$.

7. The device of claim 1, wherein the at least one light source is a light emitting diode (LED).

8. The device of claim 1, wherein the at least one light source includes between about 10 and about 30 light sources.

9. The device of claim 1, wherein the at least one light source includes a first light source configured to emit a first color of light and a second light source configured to emit a second color of light.

10. The device of claim 1, wherein the reflective coating has a thickness between about 1 micrometer and about 10 micrometers, and
    wherein the reflective coating includes a material selected from the group consisting of: titanium oxide, zinc oxide, aluminum, silver, copper, titanium, and zinc.

11. A backlit display system comprising:
    a light cavity including a bottom surface, a plurality of side walls, and a light conversion layer, the bottom surface substantially opposing the light conversion layer, the plurality of side walls extending from the bottom surface to the light conversion layer;
    a liquid crystal layer positioned above and substantially parallel to the light conversion layer;
    at least one light emitting diode on at least one of the plurality of side walls, wherein the at least one light emitting diode includes a first light emitting diode having a first intensity and a second light emitting diode have second intensity that is different than the first intensity, wherein the first light emitting diode is closer to the light conversion layer than the second light emitting diode; and
    a reflective coating on the plurality of side walls and the bottom surface;
    wherein the light cavity is configured to illuminate the liquid crystal layer.

12. The backlit display system of claim 11, wherein the reflective coating has a thickness between about 1 micrometer and about 10 micrometers, and wherein the reflective coating includes a material selected from the group consisting of: wherein the reflective coating includes a material selected from the group consisting of: titanium oxide, aluminum, silver, copper, titanium, and zinc.

13. The backlit display system of claim 11, wherein the light conversion layer includes a red phosphor layer and a green phosphor layer,
   wherein the at least one light emitting diode is configured to emit blue light at a wavelength between about 450 nanometers and about 500 nanometers, and
   wherein light from the at least one light emitting diode is emitted from an opposite side of the light conversion layer as a combination of light including red, green and blue light.

14. The backlit display system of claim 11, wherein the light conversion layer includes a red phosphor layer, a green phosphor layer, and a blue phosphor layer,
   wherein the at least one light emitting diode is configured to emit ultraviolet light at a wavelength less than about 400 nanometers, and
   wherein light from the at least one light source is emitted from an opposite side of the light conversion layer as a combination of light including red, green and blue light.

15. A device comprising:
   a bottom surface;
   a light conversion layer positioned over and spaced apart from the bottom surface, the light conversion layer including a red phosphor layer and a green phosphor layer, the red phosphor layer being closer to the bottom surface than the green phosphor layer;
   a first side surface extending from the light conversion layer to the bottom surface;
   one or more light sources formed on the first side surface, wherein the one or more light sources includes a first row of plurality of light sources and a second row of plurality of light sources, wherein the first row of plurality of light sources is closer to the light conversion layer than the second row of plurality of light sources; and
   a reflective layer formed on the bottom surface.

16. The device of claim 15, wherein the one or more light sources are configured to emit blue light, the blue light being emitted from each of the plurality of sources and having a wavelength between about 450 nanometers and about 500 nanometers,
   wherein the red phosphor layer is configured to emit red light at wavelengths between about 590 nanometers and about 750 nanometers, and
   wherein the green phosphor layer is configured to emit green light at wavelengths between about 495 nanometers and about 570 nanometers.

17. The device of claim 15, wherein the light conversion layer further includes a blue phosphor layer, the blue phosphor layer being closer to the bottom surface than the red phosphor layer and the green phosphor layer,
   wherein the one or more light sources are configured to emit ultraviolet light, the ultraviolet light being emitted from each of the plurality of sources and having a wavelength less than about 450 nanometers,
   wherein the red phosphor layer is configured to emit red light at wavelengths between about 590 nanometers and about 750 nanometers,
   wherein the green phosphor layer is configured to emit green light at wavelengths between about 495 nanometers and about 570 nanometers, and
   wherein the blue phosphor layer is configured to emit blue light at wavelengths between about 450 nanometers and about 500 nanometers.

18. The device of claim 15, wherein the reflective coating includes a material selected from the group consisting of: $SiO_2$, and $TiO_2$, and wherein the reflective coating has a thickness between about 1 micrometer and about 10 micrometers.

19. The device of claim 15, further comprising:
   a plurality of additional side surfaces, which together with the first side surface and a top surface and the bottom surface define a chamber have a first volume, wherein the light conversion layer is the top surface; and
   a plurality of reflective layers, each of the plurality of reflective layers on one of the plurality of additional side surfaces.

20. The device of claim 19, wherein the one or more light sources contains a number of light sources related to the first volume by a first ratio, and
   wherein the first ratio is between about 1 light source per cubic centimeter and about 10 sources per cubic centimeter.

* * * * *